United States Patent
Adkisson et al.

(10) Patent No.: US 9,240,448 B2
(45) Date of Patent: Jan. 19, 2016

(54) BIPOLAR JUNCTION TRANSISTORS WITH REDUCED BASE-COLLECTOR JUNCTION CAPACITANCE

(71) Applicant: International Business Machines Corporation, Armonk, NY (US)

(72) Inventors: James W. Adkisson, Jericho, VT (US); James R. Elliott, Richmond, VT (US); David L. Harame, Essex Junction, VT (US); Marwan H. Khater, Astoria, NY (US); Robert K. Leidy, Burlington, VT (US); Qizhi Liu, Lexington, MA (US); John J. Pekarik, Underhill, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/734,713

(22) Filed: Jun. 9, 2015

(65) Prior Publication Data

US 2015/0311283 A1     Oct. 29, 2015

Related U.S. Application Data

(62) Division of application No. 13/705,717, filed on Dec. 5, 2012, now Pat. No. 9,093,491.

(51) Int. Cl.
*H01L 29/732* (2006.01)
*H01L 29/06* (2006.01)
(Continued)

(52) U.S. Cl.
CPC ........ *H01L 29/0649* (2013.01); *H01L 29/0804* (2013.01); *H01L 29/0821* (2013.01); *H01L 29/1004* (2013.01); *H01L 29/7325* (2013.01)

(58) Field of Classification Search
CPC ............ H01L 29/66234; H01L 29/66257; H01L 29/66287
USPC .............. 257/565, 586, E21.35, E21.372, 257/E21.573, E21.581; 438/202, 207, 234, 438/235, 309, 312, 318, 319, 353, 359
See application file for complete search history.

(56) References Cited

U.S. PATENT DOCUMENTS 4,484,244 A    11/1984   Avery
4,885,614 A    12/1989   Furukawa et al.
(Continued)

OTHER PUBLICATIONS

"Self-aligned bipolar epitaxial base n-p-n transistors by selective epitaxy emitter window (SEEW) technology", Burghartz, J.N. et al., Electron Devices, IEEE Transactions on, vol. 38, Issue: 2, Publication Year: 1991, pp. 378-385.
(Continued)

*Primary Examiner* — Kimberly Rizkallah
*Assistant Examiner* — Maria Ligai
(74) *Attorney, Agent, or Firm* — Thompson Hine LLP; Anthony J. Canale

(57) ABSTRACT

Device structures for a bipolar junction transistor. The device structure includes a collector region, an intrinsic base formed on the collector region, an emitter coupled with the intrinsic base and separated from the collector by the intrinsic base, and an isolation region extending through the intrinsic base to the collector region. The isolation region is formed with a first section having first sidewalls that extend through the intrinsic base and a second section with second sidewalls that extend into the collector region. The second sidewalls are inclined relative to the first sidewalls. The isolation region is positioned in a trench that is formed with first and second etching process in which the latter etches different crystallographic directions of a single-crystal semiconductor material at different etch rates.

9 Claims, 13 Drawing Sheets

(51) Int. Cl.
*H01L 29/10* (2006.01)
*H01L 29/08* (2006.01)

(56) References Cited

U.S. PATENT DOCUMENTS

| | | | |
|---|---|---|---|
| 5,242,843 A | 9/1993 | Aina | |
| 5,780,905 A | 7/1998 | Chen et al. | |
| 6,011,681 A | 1/2000 | Ker et al. | |
| 6,258,634 B1 | 7/2001 | Wang et al. | |
| 6,365,924 B1 | 4/2002 | Wang et al. | |
| 6,531,369 B1 | 3/2003 | Ozkan et al. | |
| 6,566,273 B2 | 5/2003 | Kudelka | |
| 6,633,075 B1 | 10/2003 | Shirakawa | |
| 6,750,484 B2 | 6/2004 | Lippert et al. | |
| 6,767,798 B2 | 7/2004 | Kalnitsky et al. | |
| 6,784,029 B1 | 8/2004 | Vashchenko et al. | |
| 6,809,024 B1 | 10/2004 | Dunn et al. | |
| 6,812,545 B2 | 11/2004 | Dunn et al. | |
| 6,864,560 B2 | 3/2005 | Khater et al. | |
| 6,869,852 B1 | 3/2005 | Joseph et al. | |
| 6,888,221 B1 | 5/2005 | Joseph et al. | |
| 6,906,357 B1 | 6/2005 | Vashchenko et al. | |
| 6,933,540 B2 | 8/2005 | Liu et al. | |
| 6,936,910 B2 | 8/2005 | Ellis-Monaghan et al. | |
| 6,940,149 B1 | 9/2005 | Divakaruni | |
| 6,960,792 B1 | 11/2005 | Nguyen | |
| 6,964,883 B2 | 11/2005 | Chang | |
| 6,964,907 B1 | 11/2005 | Hopper et al. | |
| 6,972,443 B2 | 12/2005 | Khater | |
| 7,002,221 B2 | 2/2006 | Khater et al. | |
| 7,019,341 B2 | 3/2006 | Lippert et al. | |
| 7,034,363 B2 | 4/2006 | Chen | |
| 7,087,940 B2 | 8/2006 | Khater et al. | |
| 7,145,187 B1 | 12/2006 | Vashchenko et al. | |
| 7,196,361 B1 | 3/2007 | Vashchenko et al. | |
| 7,253,096 B2 | 8/2007 | Khater et al. | |
| 7,262,484 B2 | 8/2007 | Dunn et al. | |
| 7,327,541 B1 | 2/2008 | Wang et al. | |
| 7,371,650 B2 | 5/2008 | Bock et al. | |
| 7,394,133 B1 | 7/2008 | Vashchenko et al. | |
| 7,427,787 B2 | 9/2008 | Steinhoff | |
| 7,462,547 B2 | 12/2008 | Akatsu | |
| 7,489,359 B2 | 2/2009 | Fukumoto et al. | |
| 7,566,914 B2 | 7/2009 | Salcedo et al. | |
| 7,612,430 B2 | 11/2009 | Franosch et al. | |
| 7,639,464 B1 | 12/2009 | Vashchenko et al. | |
| 7,719,088 B2 | 5/2010 | Bock et al. | |
| 7,776,704 B2 | 8/2010 | Dunn et al. | |
| 7,842,971 B2 | 11/2010 | Liu et al. | |
| 7,888,745 B2 | 2/2011 | Khater | |
| 7,915,638 B2 | 3/2011 | Tseng et al. | |
| 7,932,541 B2 | 4/2011 | Joseph et al. | |
| 7,936,030 B2 | 5/2011 | Kim et al. | |
| 7,995,316 B2 | 8/2011 | Carpenter, Jr. et al. | |
| 8,035,190 B2 | 10/2011 | Liu et al. | |
| 8,039,868 B2 | 10/2011 | Gauthier, Jr. et al. | |
| 8,101,491 B2 | 1/2012 | Donkers et al. | |
| 8,536,012 B2 | 9/2013 | Camillo-Castillo et al. | |
| 8,716,837 B2 | 5/2014 | Camillo-Castillo et al. | |
| 8,956,945 B2 | 2/2015 | Dunn et al. | |
| 2002/0090788 A1 | 7/2002 | U'ren | |
| 2002/0117733 A1 | 8/2002 | Racanelli | |
| 2004/0188797 A1 | 9/2004 | Khater | |
| 2005/0212087 A1 | 9/2005 | Akatsu et al. | |
| 2005/0236647 A1 | 10/2005 | Khater | |
| 2006/0113634 A1 | 6/2006 | Ahmed et al. | |
| 2007/0126080 A1* | 6/2007 | Wallner | H01L 29/0649 257/565 |
| 2007/0166900 A1 | 7/2007 | Li et al. | |
| 2008/0121930 A1* | 5/2008 | Adam | H01L 29/0821 257/190 |
| 2008/0179632 A1 | 7/2008 | Adam et al. | |
| 2009/0101942 A1 | 4/2009 | Dyer | |
| 2009/0179228 A1 | 7/2009 | Joseph et al. | |
| 2012/0098039 A1 | 4/2012 | Miu | |
| 2012/0112244 A1 | 5/2012 | Camillo-Castillo et al. | |

OTHER PUBLICATIONS

European Patent Office, International Search Report and Written Opinion issued in PCT/US2013/057970 dated Nov. 12, 2013.
Hall, et al., "Silicon-germanium for ULSI", Journal of Telecommunications and Information Technology, pp. 3-4, 2000.
Liu, et al., "A dual-polarity SCR for RF IC ESD protection", 2008 International Conference on Communications, Circuits and Systems, Fujian, China, May 25-27, 2008, pp. 1228-1230.
Liu, et al., "An Improved Bidirectional SCR Structure for Low-Triggering ESD Protection Applications", IEEE Electron Device Letters, vol. 29, Na 4, Apr. 2008, pp. 360-362.
Wang, et al., "Cross-Coupling Low-Triggering Dual-Polarity CLTdSCR ESD Protection in CMOS", IEEE Electron Device Letters, vol. 31, No. 10 Oct. 2010, pp. 1143-1145.
"A low-cost fully self-aligned SiGe BiCMOS technology using selective epitaxy and a lateral quasi-single-poly integration concept" Tilke, et al., Electron Devices, IEEE Transactions on, vol. 51, Issue: 7, Publication Year: 2004, pp. 1101-1107.
Harame, et al., "The revolution in SiGe: Impact on device electronics", Applied Surface Science 224 (2004) 9-17.

\* cited by examiner

BIPOLAR JUNCTION TRANSISTORS WITH REDUCED BASE-COLLECTOR JUNCTION CAPACITANCE

BACKGROUND

The invention relates generally to semiconductor device fabrication and, in particular, to bipolar junction transistors, fabrication methods for bipolar junction transistors, and design structures for a bipolar junction transistor.

Bipolar junction transistors are typically found in demanding types of integrated circuits, especially integrated circuits destined for high-frequency applications. One specific application for bipolar junction transistors is in radiofrequency integrated circuits (RFICs), which are found in wireless communications systems, power amplifiers in cellular telephones, and other varieties of high-speed integrated circuits. Bipolar junction transistors may also be combined with complementary metal-oxide-semiconductor (CMOS) field effect transistors in bipolar complementary metal-oxide-semiconductor (BiCMOS) integrated circuits, which take advantage of the positive characteristics of both transistor types in the construction of the integrated circuit.

Conventional bipolar junction transistors constitute three-terminal electronic devices that include three semiconductor regions, namely an emitter, a base, and a collector. An NPN bipolar junction transistor includes two regions of n-type semiconductor material constituting the emitter and collector, and a region of p-type semiconductor material sandwiched between the two regions of n-type semiconductor material to constitute the base. A PNP bipolar junction transistor has two regions of p-type semiconductor material constituting the emitter and collector, and a region of n-type semiconductor material sandwiched between two regions of p-type semiconductor material to constitute the base. Generally, the differing conductivity types of the emitter, base, and collector form a pair of p-n junctions, namely a collector-base junction and an emitter-base junction. A voltage applied across the emitter-base junction of a bipolar junction transistor controls the movement of charge carriers that produce charge flow between the collector and emitter regions of the bipolar junction transistor.

Improved device structures, fabrication methods, and design structures are needed for bipolar junction transistors that enhance device performance.

SUMMARY

In an embodiment of the invention, a method is provided for fabricating a bipolar junction transistor. The method includes forming a collector region in a substrate comprised of a semiconductor material that is single crystal and forming an intrinsic base layer on the collector region. A trench is formed using a first etching process. The trench has a first section extending through the intrinsic base layer and a second section extending into the collector region. The method further includes etching the collector region adjacent to the second section of the trench with a second etching process that etches different crystallographic directions of the single-crystal semiconductor material of the substrate at different etch rates.

In an embodiment of the invention, a device structure is provided for a bipolar junction transistor. The device structure includes a collector region, an intrinsic base on the collector region, an emitter coupled with the intrinsic base and separated from the collector by the intrinsic base, and an isolation region extending through the intrinsic base to the collector region. The isolation region has a first section with a plurality of first sidewalls extending through the intrinsic base and a second section with a plurality of second sidewalls extending into the collector region. The second sidewalls are inclined relative to the first sidewalls.

In an embodiment of the invention, a hardware description language (HDL) design structure is encoded on a machine-readable data storage medium. The HDL design structure comprises elements that, when processed in a computer-aided design system, generates a machine-executable representation of a device structure for a bipolar junction transistor. The HDL design structure includes a collector region, an intrinsic base on the collector region, an emitter coupled with the intrinsic base and separated from the collector by the intrinsic base, and an isolation region extending through the intrinsic base to the collector region. The isolation region has a first section with a plurality of first sidewalls extending through the intrinsic base and a second section with a plurality of second sidewalls extending into the collector region. The second sidewalls are inclined relative to the first sidewalls. The HDL design structure may comprise a netlist. The HDL design structure may also reside on storage medium as a data format used for the exchange of layout data of integrated circuits. The HDL design structure may reside in a programmable gate array.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
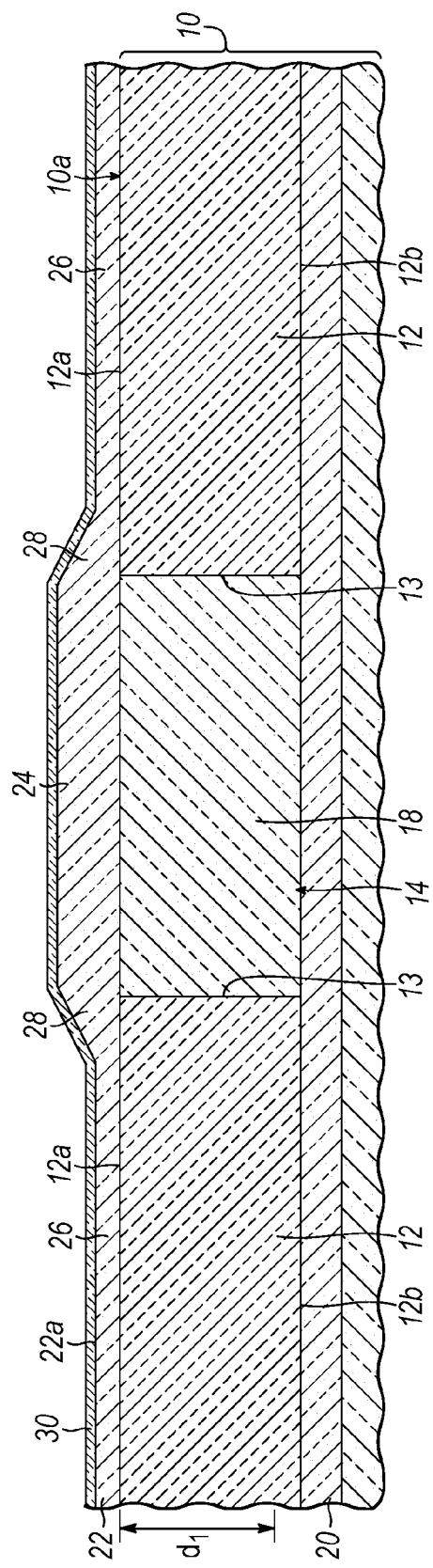
FIGS. 1-12 are cross-sectional views of a portion of a substrate at successive fabrication stages of a processing method for fabricating a device structure in accordance with an embodiment of the invention.
Figure 12:
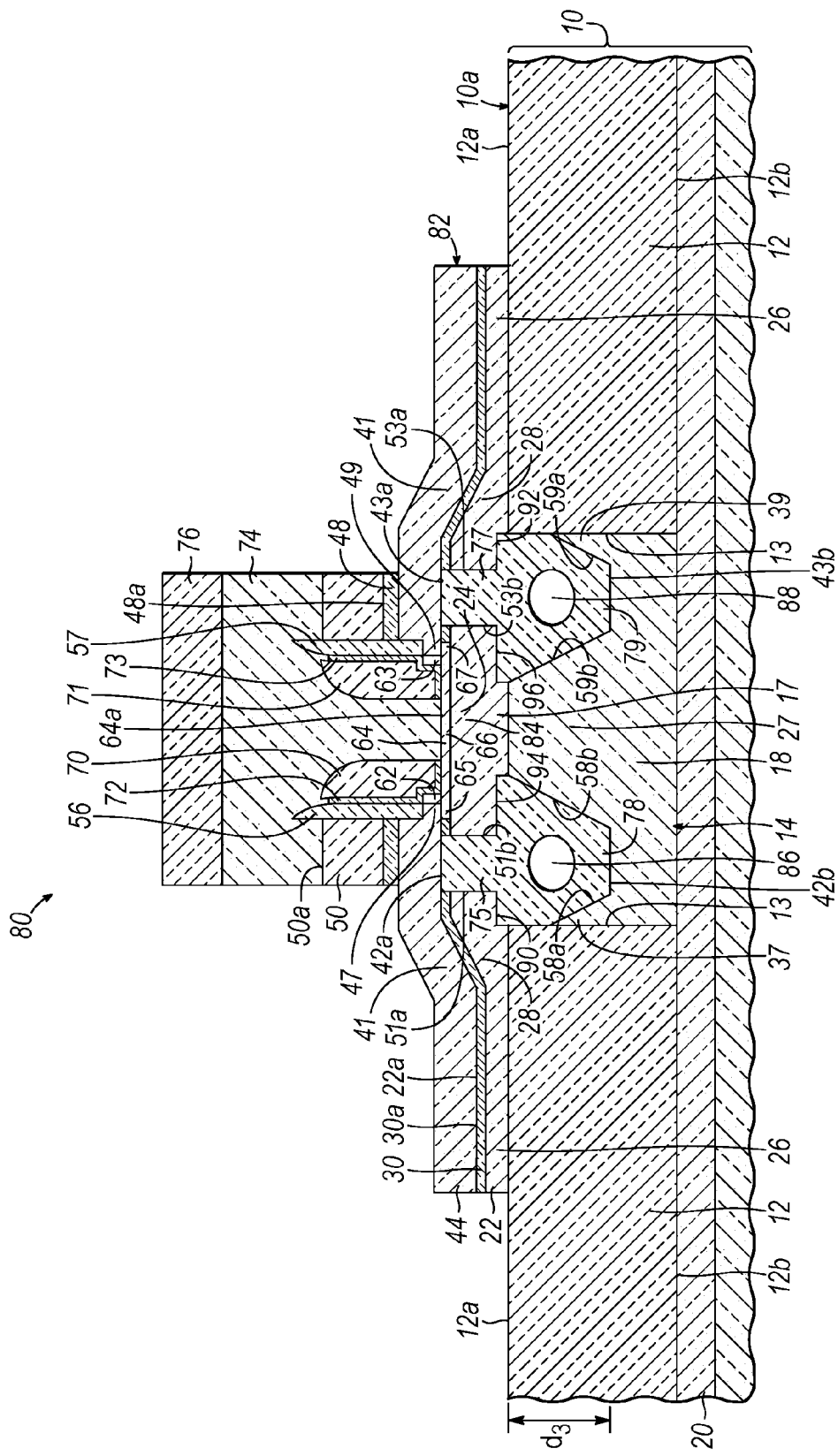

With reference to FIG. 1 and in accordance with an embodiment of the invention, a substrate 10 includes trench isolation regions 12 that circumscribe and electrically isolate a device region 14 used in the fabrication of a bipolar junction transistor 80 (FIG. 12). The substrate 10 may be any suitable bulk substrate comprising a semiconductor material that a person having ordinary skill in the art would recognize as suitable for forming an integrated circuit. For example, substrate 10 may be comprised of a wafer of a monocrystalline silicon-containing material, such as single crystal silicon with a (100) crystal lattice orientation. The semiconductor material comprising substrate 10 may be lightly doped with an impurity to alter its electrical properties and may also include an optional epitaxial layer. The top surface of the device region 14 is coextensive with a top surface 10a of the substrate 10.

The trench isolation regions 12 may be isolation structures formed by a shallow trench isolation (STI) technique that relies on a lithography and dry etching process to define closed-bottomed trenches in substrate 10, deposit an electrical insulator to fill the trenches, and planarize the electrical insulator relative to the top surface 10a of the substrate 10 using a chemical mechanical polishing (CMP) process. The dielectric may be comprised of an oxide of silicon, such as densified tetraethylorthosilicate (TEOS) deposited by chemical vapor deposition (CVD). The trench isolation regions 12 have a top surface 12a that is nominally coplanar with or slightly below the top surface 10a of the substrate 10, a bottom surface 12b, and a sidewall 13 that connects the top and bottom surfaces 12a, 12b. The bottom surface 12b is located at a depth, $d_1$, measured relative to the top surface 10a of the substrate 10.

The device region 14 includes a collector region 18 and a subcollector region 20 formed as impurity-doped regions of the same conductivity type. A top surface of the collector region 18 is coextensive with the top surface 10a of the substrate 10 and device region 14. The sidewall 13 encircles or surrounds the collector region 18 and device region 14. More specifically, the sidewall 13 is an interior surface of the trench isolation regions 12 that is coextensive with the collector region 18 and device region 14.

The collector region 18 and subcollector region 20 may be formed by introducing an electrically-active dopant, such as an impurity species from Group V of the Periodic Table (e.g., phosphorus (P), arsenic (As), or antimony (Sb)) effective to impart an n-type conductivity in which electrons are the majority carriers and dominate the electrical conductivity of the host semiconductor material. In one embodiment, the collector region 18 and the subcollector region 20 may be formed by separate ion implantations of n-type impurity species and, thereafter, annealing to activate the impurity species and alleviate implantation damage. The subcollector region 20 may be formed by a high-current ion implantation followed by a lengthy, high temperature thermal anneal that dopes a thickness of the substrate 10 before the optional epitaxial layer is formed. The collector region 18 may comprise a selectively implanted collector (SIC) formed by ion implantation in the central part of the device region 14 at an appropriate stage of the process flow. During stages of the process flow subsequent to implantation, the dopant in the collector region 18 may diffuse laterally and vertically such that substantially the entire central portion of device region 14 becomes impurity doped and, as a result, is structurally and electrically continuous with the subcollector region 20.

An intrinsic base layer 22, which is comprised of a material suitable for forming an intrinsic base of the bipolar junction transistor 80, is formed as a continuous additive layer on the top surface 10a of substrate 10 and device region 14. In the representative embodiment, the intrinsic base layer 22 directly contacts the top surface 10a of the device region 14 and also directly contacts a top surface of the trench isolation regions 12. The intrinsic base layer 22 includes a raised region 24 above the device region 14, a non-raised region 26 surrounding the raised region 24, and a facet region 28 between the raised region 24 and the non-raised region 26. The raised region 24 is laterally positioned on the top surface 10a in vertical alignment with the collector region 18. A top surface of the raised region 24 is elevated relative to a plane containing the top surface 10a of the device region 14. The raised region 24 of the intrinsic base layer 22 is circumscribed by the trench isolation regions 12. The non-raised region 26 of the intrinsic base layer 22 overlies the trench isolation regions 12.

The intrinsic base layer 22 may be comprised of a semiconductor material, such as silicon-germanium (SiGe) including silicon (Si) and germanium (Ge) in an alloy with the silicon content ranging from 95 atomic percent to 50 atomic percent and the germanium content ranging from 5 atomic percent to 50 atomic percent. The germanium content of the intrinsic base layer 22 may be uniform or the germanium content of intrinsic base layer 22 may be graded and/or stepped across the thickness of intrinsic base layer 22. If the germanium content is stepped, a thickness of the intrinsic base layer 22, such as a thickness directly contacting the collector region 18, may not contain any germanium and may be entirely comprised of silicon (Si). The intrinsic base layer 22 may be doped with one or more impurity species, such as boron and/or carbon.

Intrinsic base layer 22 may be formed after the trench isolation regions 12 are formed using a low temperature epitaxial (LTE) growth process, such as vapor phase epitaxy (VPE) that may be conducted at a growth temperature ranging from 400° C. to 850° C. The epitaxial growth process may be non-selective as single crystal semiconductor material (e.g., single crystal silicon or SiGe) is epitaxially deposited onto any exposed crystalline surface such as the exposed top surface 10a of device region 14, and non-monocrystalline semiconductor material (e.g., polysilicon or polycrystalline SiGe) is deposited non-epitaxially onto the non-crystalline material of the trench isolation regions 12. The growth process generally causes the intrinsic base layer 22 to incorporate topography.

The raised region 24 of the intrinsic base layer 22 is comprised of monocrystalline semiconductor material and the non-raised region 26 of the intrinsic base layer 22 is comprised of polycrystalline semiconductor material. In the absence of epitaxial seeding over the trench isolation regions 12, the non-raised region 26 forms with a low growth rate outside of the device region 14. The facet region 28 of the intrinsic base layer 22 may be comprised of a mixture of polycrystalline and monocrystalline material or comprised of primarily single crystal material in facet region 28. The thickness of the intrinsic base layer 22 may range from about 10 nm to about 600 nm with the raised region 24 having the largest layer thickness among the different regions 24, 26, 28. Layer thicknesses herein are evaluated in a direction normal to the top surface 10a of substrate 10.

A base dielectric layer 30 is formed on a top surface 22a of intrinsic base layer 22 and, in the representative embodiment, directly contacts the top surface 22a. The base dielectric layer 30, which reproduces the topography of the underlying intrinsic base layer 22, may be comprised of an electrical insulator with a dielectric constant (e.g., a permittivity) characteristic of a dielectric material. In one embodiment, the base dielectric layer 30 may be comprised of a high temperature oxide (HTO) deposited using rapid thermal process (RTP) at temperatures of 500° C. or higher. Alternatively, the base dielectric layer 30 may be comprised of oxide formed by a different deposition process, thermal oxidation of silicon (e.g., oxidation at high pressure with steam (HIPDX)), or a combination of these processes.

Figure 2:
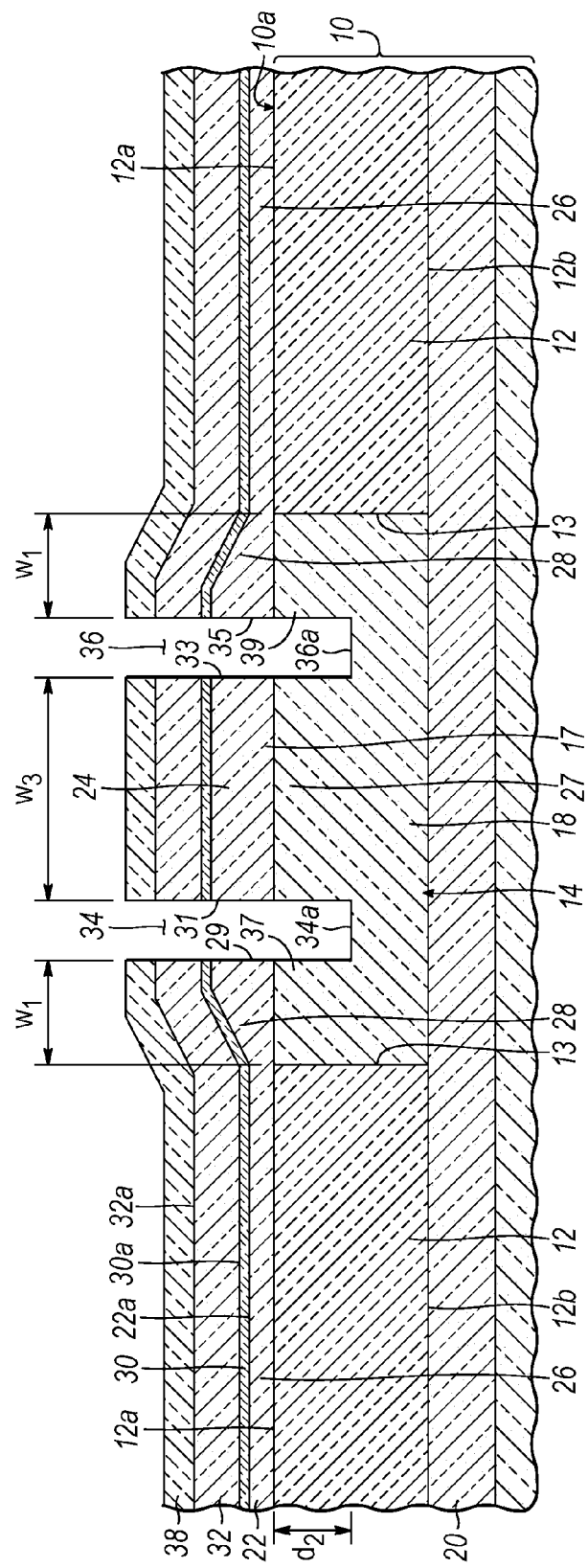

With reference to FIG. 2 in which like reference numerals refer to like features in FIG. 1 and at a subsequent fabrication stage of the processing method, a sacrificial layer 32 is deposited on the top surface 30a of the base dielectric layer 30. In a representative embodiment, the sacrificial layer 32 may be comprised of polysilicon or amorphous silicon deposited by CVD using either silane or disilane as a silicon source. A cap layer 38 is applied on a top surface 32a of layer 32 and may be comprised of a different material type, e.g., silicon dioxide, than layer 32 and that is not etched by the selective etching process applied subsequently in the process flow.

Trenches 34, 36 are formed that extend from a top surface of the cap layer 38 completely through the cap layer 38, the sacrificial layer 32, the base dielectric layer 30, the intrinsic base layer 22, and into the portion of the device region 14 that includes the collector region 18. Trench 34 includes an exterior sidewall 29 and an interior sidewall 31 joined to the exterior sidewall 29 by a bottom surface 34a. Trench 36 includes an interior sidewall 33 and an exterior sidewall 35 joined to the exterior sidewall 35 by a bottom surface 36a. The trenches 34, 36 have a shallower depth relative to the top surface 10a than the trench isolation regions 12. Specifically, the surfaces 34a, 36a are located at a depth, $d_2$, measured relative to the top surface 10a of the substrate 10 that is shallower than the depth, $d_1$, of the bottom surfaces 12b of the trench isolation regions 12. The trenches 34, 36 are narrow in comparison with the width of the trench isolation regions 12. The sidewalls 29, 31, 33, 35 have a substantially vertical and parallel alignment, and may be oriented at respective right angles relative (i.e., perpendicular) to the top surface 10a of substrate 10.

Respective sections 37, 39 of the collector region 18 are disposed between the portion of the trenches 34, 36 in the collector region 18 and the trench isolation regions 12. The exterior sidewalls 29, 35 of the trenches 34, 36 are respective nearest-neighbor sidewalls to the sidewall 13 of the trench isolation regions 12, and are laterally spaced from the sidewall 13 to form the sections 37, 39. Section 37 of the collector region 18 is coextensive with the sidewall 13 and is coextensive with the exterior sidewall 29. Section 39 of the collector region 18 is coextensive with the sidewall 13 and is coextensive with the exterior sidewall 35. The sections 37, 39 of the collector region 18 are characterized by a width dimension, $w_1$.

An interior section 27 of the collector region 18 is disposed between the trenches 34, 36 and, in particular, between the interior sidewalls 31, 33 of the trenches 34, 36. The interior section 27 of the collector region 18 and an overlying interior section 17 of the intrinsic base layer 22 in the raised region 24 share a common width, $w_3$. The sections 17, 27 are in direct contact with each other in the representative embodiment.

In one embodiment, the trenches 34, 36 may comprise linear open volumes that are aligned parallel to each other so that the sections 37, 39 comprise strips of semiconductor material. In this embodiment, the trenches 34, 36 and sections 37, 39 do not have a closed geometrical shape. In an alternative embodiment, the trenches 34, 36 may join or may be joined by additional trenches so that the trenches 34, 36 surround or encircle the interior section 27 of the collector region 18 and thereby form a closed geometrical shape. The intervening sections 37, 39 of the collector region 18 would likewise join or be joined by additional portions of the collector region 18 so that the sections 37, 39 surround or encircle the trenches 34, 36.

The trenches 34, 36 may be formed using a photolithography process and a non-selective etching process. To that end, a mask layer (not shown) may be applied on the top surface of the cap layer 38. The mask layer may comprise a photoresist that is applied as a layer by a spin coating process, pre-baked, exposed to a radiation projected through a photomask, baked after exposure, and developed with a chemical developer to form an etch mask that includes a pattern of openings coinciding with the intended locations of the trenches 34, 36. The pattern of openings is transferred from the mask layer to the sacrificial layer 32, the base dielectric layer 30, the intrinsic base layer 22, and the collector region 18 to define the trenches 34, 36 by the non-selective etching process. The non-selective etching process may comprise a wet etching process or a dry etching process, such as reactive-ion etching (RIE) that produces vertical sidewalls 29, 31, 33, 35. The non-selective etching process, which may be conducted in a single etching step or multiple steps, relies on one or more etch chemistries that remove the materials of the cap layer 38, the sacrificial layer 32, the base dielectric layer 30, the intrinsic base layer 22, and the collector region 18, and may comprise a timed etch. The mask layer is removed in response to forming the trenches 34, 36. If comprised of a photoresist, the mask layer may then be removed by ashing or solvent stripping, followed by a conventional cleaning process.

When formed, the substrate 10 may be rotationally oriented in the lithography tool used to pattern the mask layer in the photolithography process using a feature on the substrate, such as a notch at a peripheral edge, as an angular reference. Alignment marks on the substrate 10 and photomask may also be aligned in the photolithography tool to assist in rotationally orienting the substrate 10. The openings subsequently formed in the patterned mask layer are aligned with a crystallographic plane or orientation of the crystalline semiconductor material of substrate 10. For example, the openings may be oriented parallel to the [100] directions of a single crystal silicon substrate. The preferential alignment is transferred by the etching process from the openings in the mask to the portion of the trenches 34, 36 in the collector region 18. In particular, the sidewalls 29, 31 of trench 34 and the sidewalls 33, 35 of trench 36 are each aligned with a crystallographic plane or orientation of the crystalline semiconductor material of substrate 10.

Figure 3:
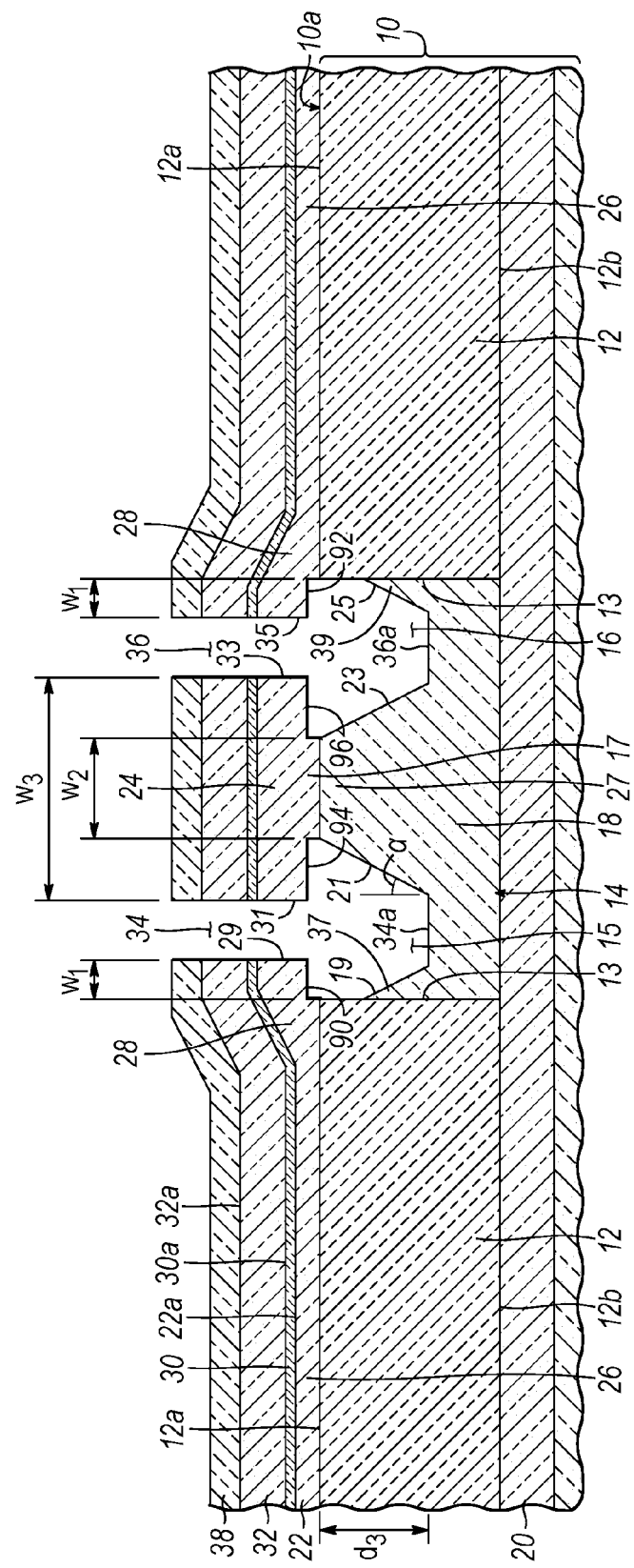

With reference to FIG. 3 in which like reference numerals refer to like features in FIG. 2 and at a subsequent fabrication stage of the processing method, a lower section 15 of trench 34 within the collector region 18 and a lower section 16 of trench 36 within the collector region 18 are each modified utilizing an orientation-dependent etching process, called an anisotropic etching process herein, that may have different etch rates for different crystallographic directions in a semiconductor, or that may have different etch rates for semiconductors of different doping or different compositions. Trench 34 is altered to have an exterior sidewall 19 and an interior sidewall 21 in lower section 15 resulting from the etching of the bordering semiconductor material of the collector region 18. Trench 36 is altered to have an exterior sidewall 23 and an interior sidewall 25 in lower section 16 resulting from the etching of the bordering semiconductor material of the collector region 18. The original sidewalls 29, 31 of trench 34 extending through the intrinsic base layer 22 and the original sidewalls 33, 35 of trench 36 extending through the intrinsic base layer 22 are not significantly modified by the anisotropic etching process and remain aligned perpendicular to the top surface 10a. While not depicted, layer 32 may be recessed slightly along the sidewalls 29, 31, 33, 35 by the anisotropic etching process.

Sidewalls 19, 21, 23, 25 have a non-perpendicular (i.e., inclined) orientation relative to the top surface 10a following the anisotropic etching process of FIG. 3. Each of the sidewalls 19, 21, 23, 25 becomes inclined at an angle, a, relative to the top surface 10a of substrate 10. Sidewalls 19, 21, 23, 25 are also inclined at the angle, a, relative to the top surface 10a of substrate 10 and relative to the sidewalls 29, 31, 33, 35 of the trenches 34, 36 in the intrinsic base layer 22 and base dielectric layer 30. The depth of the trenches 34, 36 may not be significantly increased because the etch of the bottom surfaces 34a, 36a is dependent on the etch of the sidewalls 29, 31, 33, 35, which are of a crystallographic plane or orientation that etches with a considerably slower etch rate. However, the surfaces 34a, 36a may be located at a depth, $d_3$, measured relative to the top surface 10a at the conclusion of the anisotropic etching process that is deeper than depth, $d_2$, but shallower than depth, $d_1$.

The anisotropic etching process is selective in that the semiconductor material of the substrate 10 is removed at a higher rate than the semiconductor material comprising at least a portion of the intrinsic base layer 22 or the electrical insulators comprising the base dielectric layer 30 and trench isolation regions 12. In particular, the intrinsic base layer 22 may be comprised of silicon that may include a varying composition with germanium of various contents over different thicknesses and only silicon over a thickness directly contacting to the collector region 18.

The trench isolation regions 12 limit the lateral advance of the etching process so that the inclined sidewalls 19, 25 of the trench sections 15, 16 may terminate at the trench isolation regions 12. As a result, sections 90, 92 of the intrinsic base layer 22 are undercut by the partial removal of the collector region 18 and, depending on the composition (e.g., silicon without added germanium over a thickness adjacent to the collector region 18), may be recessed vertically by the partial removal of the sections 90, 92. The shape of the sections 37, 39 of the collector region 18 is also modified by the anisotropic etching process. As a result, the sections 37, 39 of the collector region 18 may no longer intervene over the entire height of the trench sections 15, 16 between the trenches 34, 36 and the trench isolation regions 12.

The distance between the interior sidewall 21 and the interior sidewall 23 of trench 36 in the collector region 18 is reduced by the anisotropic etching process so that the width, $w_2$, of the interior section 27 of the collector region 18 between the trenches 34, 36 is reduced in comparison with the initial width, $w_3$. The inclination of the interior sidewalls 21, 23 from the partial removal of the collector region 18 undercuts sections 94, 96 of the intrinsic base layer 22 and, depending on the composition (e.g., silicon without added germanium over a thickness adjacent to the collector region 18), may be recessed vertically by the partial removal of the sections 94, 96. Interior section 17 of the intrinsic base layer 22 in the raised region 24 retains the width, $w_3$, which is greater than the width, $w_2$. Assuming equivalent lengths for the interior section 17 of the intrinsic base layer 22 and the interior section 27 of the collector region 18, then the area of the interior section 17 of the intrinsic base layer 22 is larger than the area of the interior section 27 of the collector region 18.

The anisotropic etching process used to remove the material of the substrate 10 to achieve the shape modification of the trenches 34, 36 in the collector region 18 may be any suitable etching process. Anisotropic etching processes etch the semiconductor material bordering the sidewalls 19, 21, 23, 25 of the respective sections 15, 16 of trenches 34, 36 in all crystallographic directions, but at significantly different etching rates that differ significantly for different crystal directions or planes. For example, silicon etching in TMAH is slow for (111) crystal planes compared to other directions, such as (100) planes or (110) planes. Therefore, the etch pattern formed by the anisotropic etching process proceeds along the crystal planes of higher etching rate and is eventually terminated by the crystal planes of lower etching rate. The absolute etch rates in each crystallographic direction and the relative etch rate in different crystallographic directions may be dependent upon factors such as solution strength (i.e., concentration) of the etchant and solution temperature of the etchant. The etch time for exposure to the etchant may be selected to be adequate to produce a targeted change in geometrical shape of the sidewalls 19, 21, 23, 25 of the sections 15, 16 of trenches 34, 36. In one embodiment, the anisotropic etching process may be a wet chemical etching process that uses an etchant comprising ammonium hydroxide ($NH_4OH$), tetramethylammonium hydroxide (TMAH), ethylenediamine pyrocatechol (EDP), or potassium hydroxide (KOH).

In a representative embodiment in which the substrate 10 is single crystal silicon having a [100] surface normal and the trenches 34, 36 are aligned with a [100] direction, the sidewalls 29, 31, 33, 35 of trenches 34, 36 are aligned with crystallographically equivalent (110) planes before the anisotropic etching process is performed. After a given timed etch, the sidewalls 19, 21, 23, 25 of the sections 15, 16 of trenches 34, 36 are inclined at a nominal angle, α, of 45° relative to the top surface 10a.

The anisotropic etching process is selective to the materials of the base dielectric layer 30 and at least a portion of the intrinsic base layer 22. For example, a portion of the intrinsic base layer 22 may be a sub-layer have a composition containing germanium (in the stepped and/or graded profile discussed hereinabove) and this portion of the intrinsic base layer 22 may etch at a significantly slower rate than the material of the sacrificial layer 32. If the portion of the intrinsic base layer 22 adjacent to the collector region 18 is silicon without germanium content, the surfaces 90, 92, 94, 96 may reflect removal of the silicon by the anisotropic etch process. Because of the etch selectivity, the sidewalls 29, 31, 33, 35 of trenches 34, 36 in the intrinsic base layer 22 are not impacted to a significant extent by the anisotropic etching process. As a result, the sidewalls 29, 31, 33, 35 of trenches 34, 36 in the intrinsic base layer 22 retain their original dimensions, including width, and remain nominally vertical and perpendicular to the top surface 10a.

Figure 4:
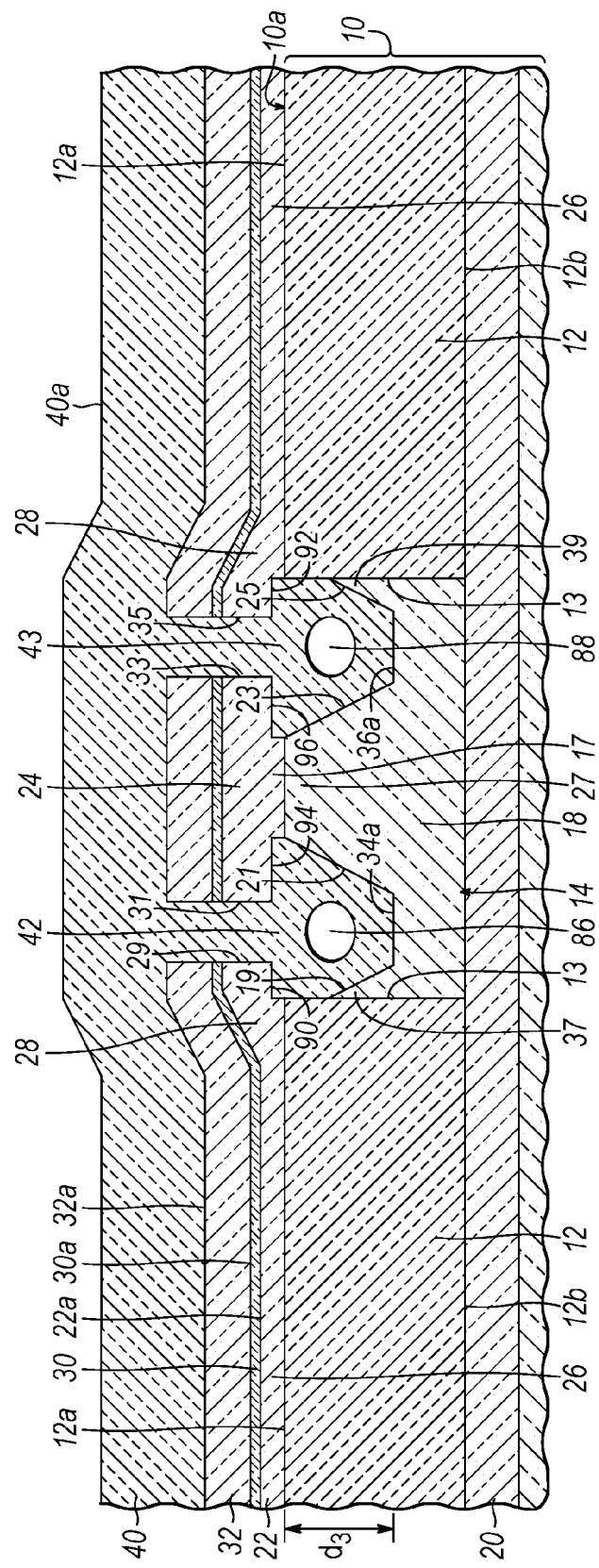

With reference to FIG. 4 in which like reference numerals refer to like features in FIG. 3 and at a subsequent fabrication stage of the processing method, isolation regions 42, 43 comprised of an electrical insulator are formed in the trenches 34, 36. To that end, a dielectric layer 40 is applied that fills the trenches 34, 36 respective portions of the electrical insulator. The dielectric layer 40 also deposits on the top surface 32a of the sacrificial layer 32.

Dielectric layer 40 may comprise any suitable organic or inorganic dielectric material recognized by a person having ordinary skill in the art. The dielectric layer 40 may be comprised of an electrical insulator, which may be characterized by an electrical resistivity at room temperature of greater than $10^{10}$(Ω-m). Candidate inorganic dielectric materials for dielectric layer 40 may include, but are not limited to, silicon dioxide ($SiO_2$), fluorine-doped silicon glass (FSG), and combinations of these dielectric materials. Alternatively, dielectric layer 40 may comprise a low-k dielectric material characterized by a relative permittivity or dielectric constant smaller than the $SiO_2$ dielectric constant of approximately 3.9. Candidate low-k dielectric materials for dielectric layer 40 include, but are not limited to, porous and nonporous spun-on organic low-k dielectrics, such as spin-on spun-on aromatic thermoset polymer resins like polyarylenes, porous and nonporous inorganic low-k dielectrics, such as organosilicate glasses, hydrogen-enriched silicon oxycarbide (SiCOH), and carbon-doped oxides, and combinations of these and other organic and inorganic dielectrics. Dielectric layer 40 may be deposited by any number of techniques including, but not limited to, sputtering, spin-on application, or CVD.

In the representative embodiment, isolation regions 42, 43 may include subsurface voids 86, 88 that are introduced into the constituent dielectric material during deposition. The voids 86, 88 operate to lower the composite dielectric constant of the dielectric material comprising isolation regions 42, 43. The voids 86, 88 represent empty spaces devoid of solid matter. The voids 86, 88 may have an effective dielectric constant of approximately unity (about 1.0) and may be filled by air at or near atmospheric pressure, filled by another gas at or near atmospheric pressure, or contain air or gas below atmospheric pressure (e.g., a partial vacuum) in the completed microelectronic structure. The voids 86, 88 are preferably buried at a depth within the isolation regions 42, 43 and beneath the top surface 40a of the dielectric layer 40 such that the voids 86, 88 remain sealed during subsequent processing steps.

In one specific embodiment, the dielectric layer 40 may be comprised of an oxide of silicon (e.g., $SiO_2$) that may be deposited by low pressure chemical vapor phase deposition (LPCVD) using a silicon source of either silane or a mixture of silane with nitrogen. LPCVD is conducted at a pressure lower than atmospheric pressure, which may tend to reduce unwanted gas-phase reactions and improve film thickness uniformity across the substrate 10. For example, the substrate temperature during LPCVD may range from 600° C. to 650° C. and the process chamber pressure during LPCVD may be constrained in a range between 25 Pa and 150 Pa.

Figure 5:
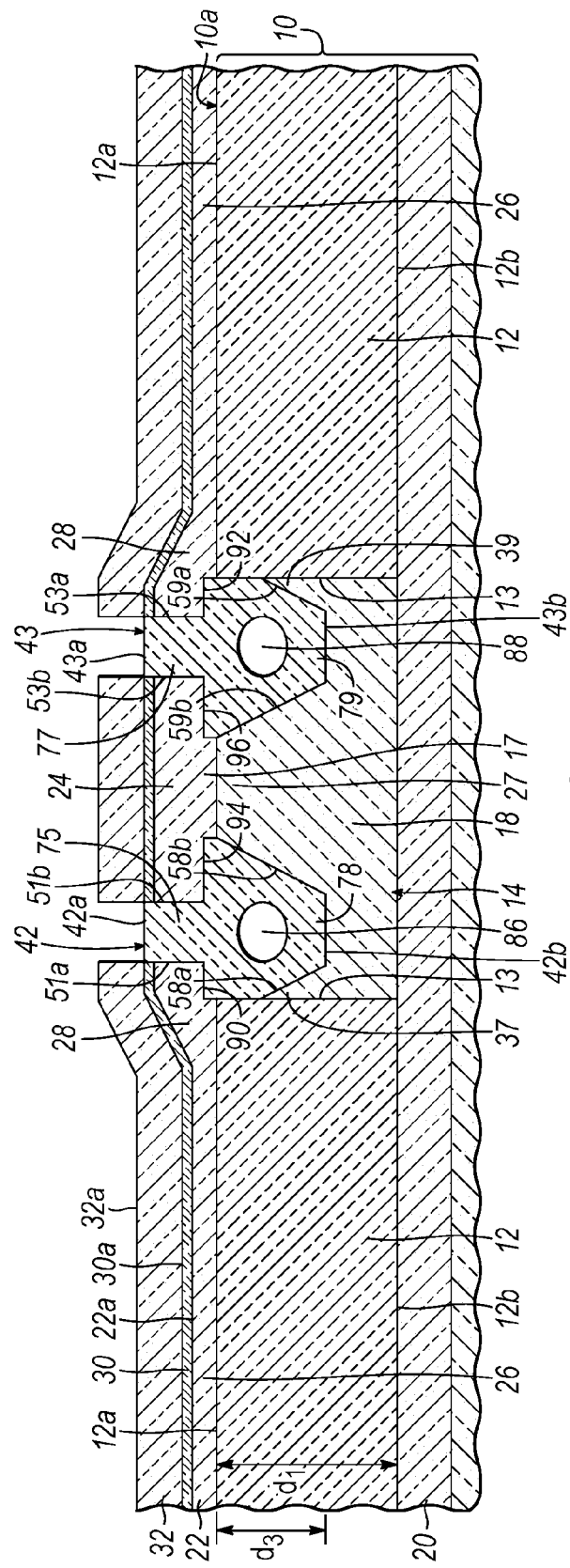

With reference to FIG. 5 in which like reference numerals refer to like features in FIG. 4 and at a subsequent fabrication stage of the processing method, the dielectric layer 40 is removed from the top surface 32a of the sacrificial layer 32 but not from within the trenches 34, 36. The dielectric layer 40 may be removed from the top surface 32a of sacrificial layer 32 by a wet etching process or a dry etching process, which may be end-pointed based upon exposure of the sacrificial layer 32 or may alternatively be timed. If the dielectric layer 40 is comprised of an oxide of silicon, then RIE may be employed to remove the dielectric layer 40 from the top surface 32a of sacrificial layer 32. Alternatively, an oxide etch, such as buffered hydrofluoric acid or diluted hydrofluoric acid, may be used to remove the dielectric layer 40. The top surface 32a of the sacrificial layer 32 is exposed after the overlying thickness of the dielectric layer 40 is removed.

The isolation regions 42, 43 of the dielectric layer 40 inside the trenches 34, 36 may be recessed relative to the top surface 32a of the sacrificial layer 32 but are not removed by the etching process. The isolation regions 42, 43 penetrate through the intrinsic base layer 22 and base dielectric layer 30, and extend into the collector region 18 to the depth, $d_2$, relative to a reference plane including the top surface 10a. The depth, $d_2$, is less than the depth, $d_1$, of the bottom surfaces 12b of the trench isolation regions 12 relative to the same reference plane (e.g., the top surface 10a of substrate 10).

Isolation region 42 has an upper surface 42a, an exterior sidewall 51a and an interior sidewall 51b of a section 75 extending through the intrinsic base layer 22 and base dielectric layer 30, an exterior sidewall 58a and an interior sidewall 58b of a section 78 extending into the collector region 18, and a lower surface 42b. Isolation region 43 has an upper surface 43a, an exterior sidewall 53a and an interior sidewall 53b of a section 77 extending through the intrinsic base layer 22 and base dielectric layer 30, an exterior sidewall 59a and an interior sidewall 59b of a section 79 extending into the collector region 18, and a lower surface 43b. The isolation regions 42, 43 reproduce the geometrical shape of the trenches 34, 36 and, in particular, the isolation regions 42, 43 reproduce the geometrical shape of the trench sections 15, 16 within the collector region 18. The sidewalls 58a, 58b of the section 78 of isolation region 42 are inclined at angle, a, and diverge in a direction toward the top surface 10a such that the width of the isolation region section 78 increases in a direction away from the bottom surface 42b and toward the top surface 10a. The sidewalls 59a, 59b of the section 79 of isolation region 43 are also inclined at angle, $\alpha$, and diverge in a direction toward the top surface 10a such that the width of the isolation region section 79 increases in a direction away from the bottom surface 43b and toward the top surface 10a. At or slightly above the top surface 10a, the collector region has the width $w_2$ because of the inclined sidewalls 58b, 59b.

A portion of the sidewall 58a is separated by the section 37 of the collector region 18 from the interior sidewall 13 of the nearest-neighbor trench isolation region 12. A portion of the sidewall 59a is separated by the section 39 of the collector region 18 from the interior sidewall 13 of the nearest-neighbor trench isolation region 12. The isolation region sections 75, 77 retain the original comparatively narrow width because the corresponding trench portions are not enlarged by the action of the anisotropic etching process (FIG. 3). In particular, the width of the isolation region sections 75, 77 is less than the average width of the isolation region sections 78, 79.

The respective top surfaces 42a, 43a of the isolation regions 42, 43 may be vertically positioned within the trenches 34, 36 so that the isolation regions 42, 43 are nominally coplanar with the top surface 30a of base dielectric layer 30. Alternatively, the height of the respective top surfaces 42a, 43a of the isolation regions 42, 43 may differ from the representative embodiment so that the top surfaces 42a, 43a are either above or below the top surface 30a. While depicted as flat in the representative embodiment, the top surfaces 42a, 43a of the isolation regions 42, 43 may include divots.

In one embodiment, the isolation regions 42, 43 may comprise lengths of electrical insulator that are aligned parallel to each other. In this embodiment, the isolation regions 42, 43 do not define a closed geometrical shape. In an alternative embodiment, the isolation regions 42, 43 may join or may be joined by additional trenches so that the isolation regions 42, 43 surround or encircle the interior portion of the collector region 18 to form a closed geometrical shape.

Figure 6:
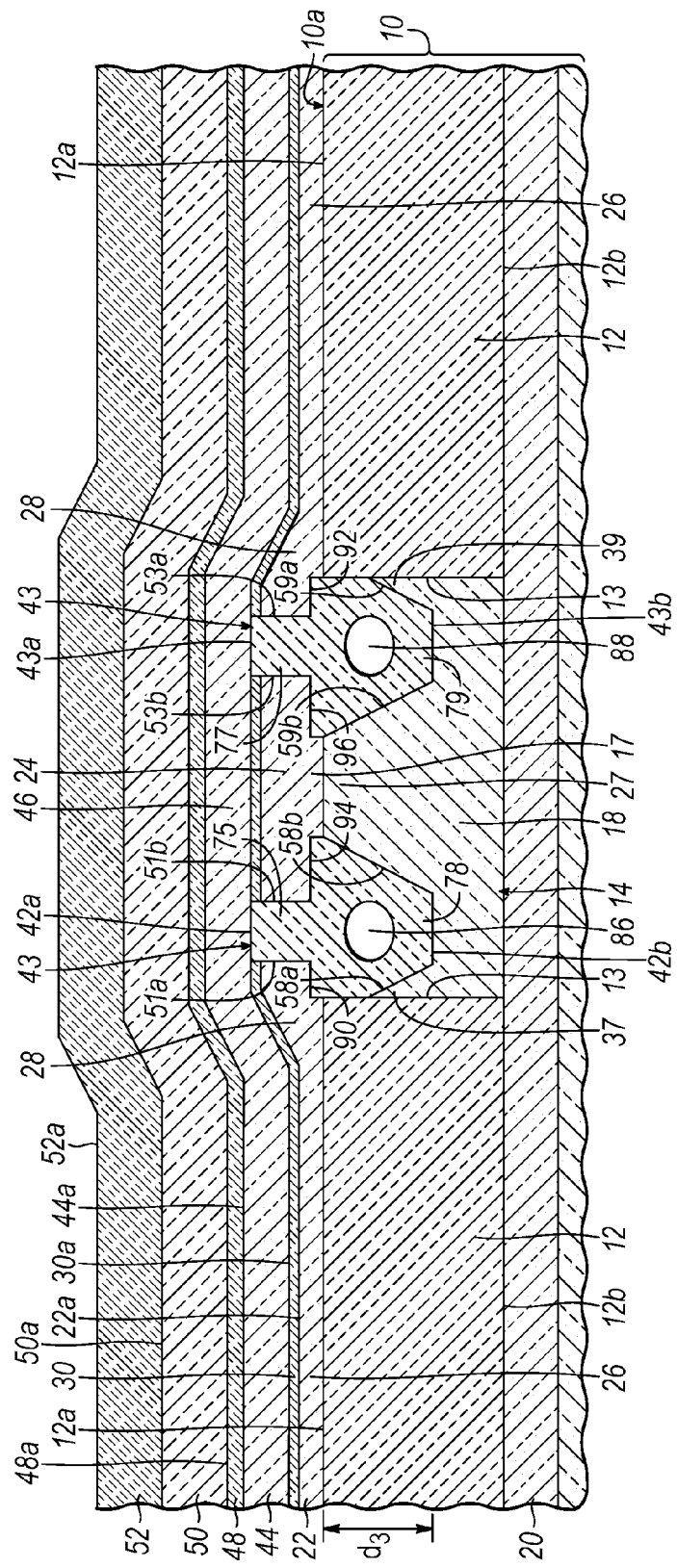

With reference to FIG. 6 in which like reference numerals refer to like features in FIG. 5 and at a subsequent fabrication stage of the processing method, the sacrificial layer 32 is removed to reduce the height difference between the top surface 30a of the base dielectric layer 30 and the isolation regions 42, 43 of the dielectric layer 40. The sacrificial layer 32 may be removed by a wet etching process or a dry etching process. In particular, if the sacrificial layer 32 is comprised of polysilicon, the sacrificial layer 32 may be partially or completely removed by an etching process, such as a dry etching process or a wet etching process (e.g., an aqueous mixture of nitric acid ($HNO_3$) and hydrofluoric acid (HF)). The base dielectric layer 30 may operate as an etch stop for the removal of the sacrificial layer 32 if the materials comprising the sacrificial layer 32 and base dielectric layer 30 are selected such that the sacrificial layer 32 can be selectively etched relative to base dielectric layer 30. The base dielectric layer 30 is exposed in field regions surrounding the trenches 34, 36.

An extrinsic base layer 44 is formed on the top surface 30a of the base dielectric layer 30. In one embodiment, the extrinsic base layer 44 may be comprised of polycrystalline semiconductor material (e.g., polysilicon or polycrystalline SiGe) deposited by CVD process. If the extrinsic base layer 44 is comprised of SiGe, the concentration of Ge may have a graded or an abrupt profile and may include additional layers, such as a Si cap. The extrinsic base layer 44 may be in situ doped with a concentration of a dopant, such as an impurity species from Group III of the Periodic Table (e.g., boron) effective to impart p-type conductivity. As a consequence of the deposition process and the non-crystalline nature of base dielectric layer 30 on which extrinsic base layer 44 is formed, the entire extrinsic base layer 44 is comprised of polycrystalline or amorphous semiconductor material.

The uneven topology of the underlying intrinsic base layer 22 is reproduced in the extrinsic base layer 44 so that the extrinsic base layer 44 has a raised region 46 that overlies and is aligned with the raised region 24 of the intrinsic base layer 22. If the sacrificial layer 32 is only partially removed before the extrinsic base layer 44 is deposited and is comprised of, for example, polysilicon, then the remaining thickness of the sacrificial layer 32 is subsumed into the extrinsic base layer 44. The extrinsic base layer 44 also covers the top surfaces 42a, 43a of the isolation regions 42, 43.

A stack of dielectric layers 48, 50, 52, which also reproduces the topology of the underlying intrinsic base layer 22, is then formed on the extrinsic base layer 44. Dielectric layer 48, which is formed on a top surface 44a of extrinsic base layer 44, may directly contact the top surface 44a. Dielectric layer 50, which is formed on a top surface 48a of dielectric layer 48, may directly contact the top surface 48a. Dielectric layer 52, which is formed on a top surface 50a of dielectric layer 50, may directly contact the top surface 50a. Dielectric layer 48 and dielectric layer 52 may be comprised of the same electrical insulator, such as $SiO_2$ deposited by CVD. Dielectric layer 50 may be comprised of an electrical insulator with a different etch selectivity than dielectric layers 48, 52. Dielectric layer 50 may be comprised of silicon nitride ($Si_3N_4$) deposited using CVD.

Figure 7:
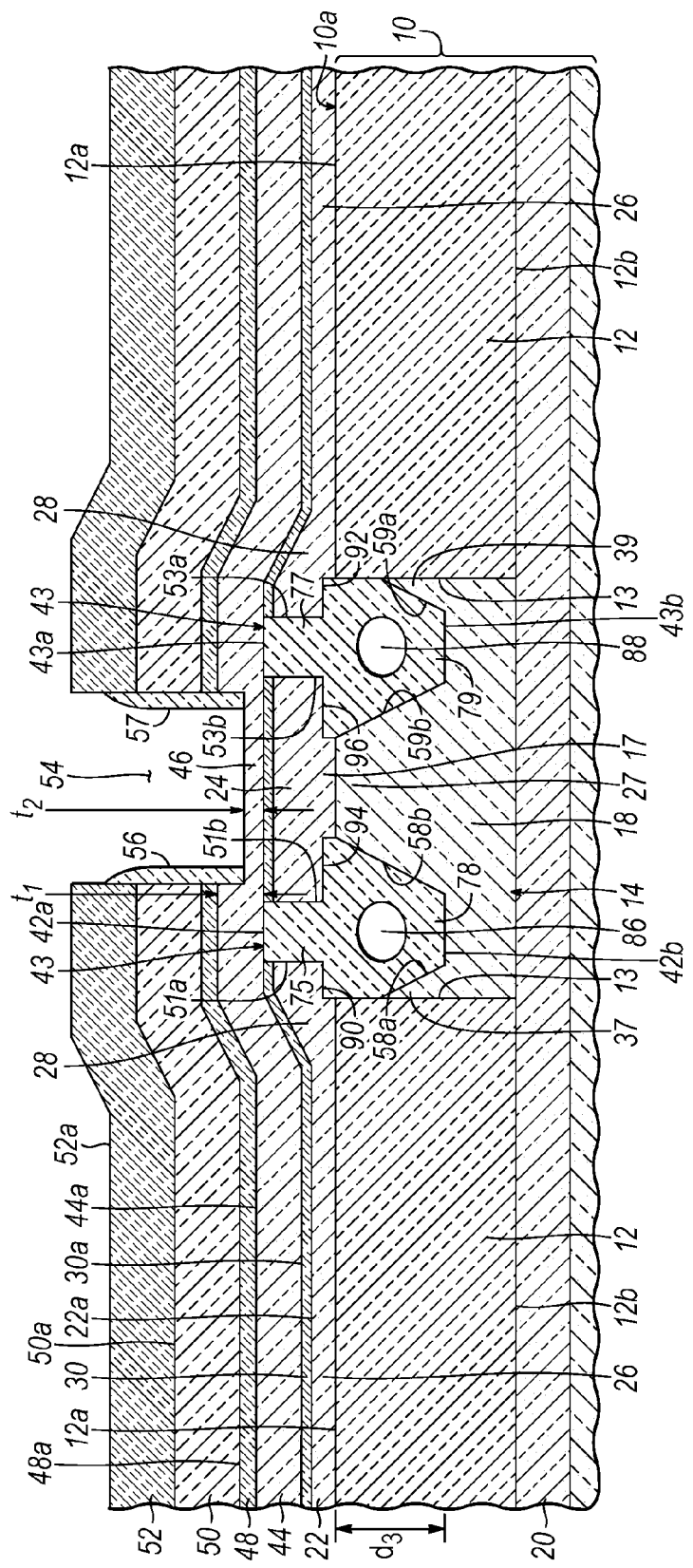

With reference to FIG. 7 in which like reference numerals refer to like features in FIG. 6 and at a subsequent fabrication stage of the processing method, dielectric layers 48, 50, 52 are patterned using photolithography and etching processes to define an emitter opening 54 aligned with the raised region 24 of the intrinsic base layer 22. To that end, a patterned etch mask (not shown) is applied to the dielectric layer 52. In one embodiment, the etch mask may be a photoresist layer comprised of a sacrificial organic material applied by spin coating to the top surface 52a of dielectric layer 52. The photolithography process that patterns the photoresist layer exposes the photoresist to radiation imaged through a photomask and develops the resulting latent feature pattern in the exposed photoresist to define a window at the intended location for the emitter opening 54. The etching process, which may be RIE, forms the emitter opening 54 in the dielectric layers 48, 50, 52 by sequentially removing regions of each of the dielectric layers 48, 50, 52 unprotected by the etch mask. The etching process, which may be conducted in a single etching step or multiple steps, relies on one or more etch chemistries that remove the individual dielectric layers 48, 50, 52 and may comprise one or more discrete timed or end-pointed etches.

The emitter opening 54 is extended by an etching process, such as RIE, into the raised region 46 of the extrinsic base layer 44. The etching process is controlled such that the emitter opening 54 is only partially extended through the thickness of the extrinsic base layer 44. Specifically, a thickness of the raised region 46 of the extrinsic base layer 44 is partially removed by the etching process across the surface area of the top surface 44a that is exposed inside the emitter opening 54 in dielectric layers 48, 50, 52. After etching, the top surface 44a of extrinsic base layer 44 in the raised region 46 is recessed (i.e., in a different plane) relative to a plane containing the top surface 44a of the extrinsic base layer 44 in masked regions. The raised region 46 of the extrinsic base layer 44 has a thickness $t_2$, measured normal to the top surface 44a, over its surface area inside the emitter opening 54. The thickness $t_2$ is less than the thickness $t_1$ of the extrinsic base layer 44 (and the raised region 46) outside of the emitter opening 54, which gives rise to a thickness difference. The etching process may be controlled such that the emitter opening 54 extends approximately half-way through the layer thickness of the extrinsic base layer 44 and, as a result, the thickness $t_2$ is approximately one-half of the thickness $t_1$.

Following the conclusion of the etching process, the etch mask is removed. If comprised of photoresist, the etch mask may be removed by oxygen plasma ashing or chemical stripping.

Spacers 56, 57 are formed on the vertical sidewalls of the layers 44, 48, 50, 52 bounding the emitter opening 54. The spacers 56, 57, which extend vertically to the base of the emitter opening 54, may directly contact the recessed top surface 44a of extrinsic base layer 44. The spacers 56, 57 may be formed by depositing a conformal layer comprised of an electrical insulator and shaping the conformal layer with an anisotropic etching process, such as a RIE process, that preferentially removes the electrical insulator from horizontal surfaces. At the conclusion of the anisotropic etching process, the spacers 56, 57 constitute residual electrical insulator residing on the vertical surfaces represented by the coplanar sidewalls of the layers 44, 48, 50, 52. The spacers 56, 57 may be comprised of a dielectric material that is an electrical insulator, such as $Si_3N_4$ deposited by CVD in which instance the spacers 56, 57 are composed of the same dielectric material as dielectric layer 50.

Figure 8:
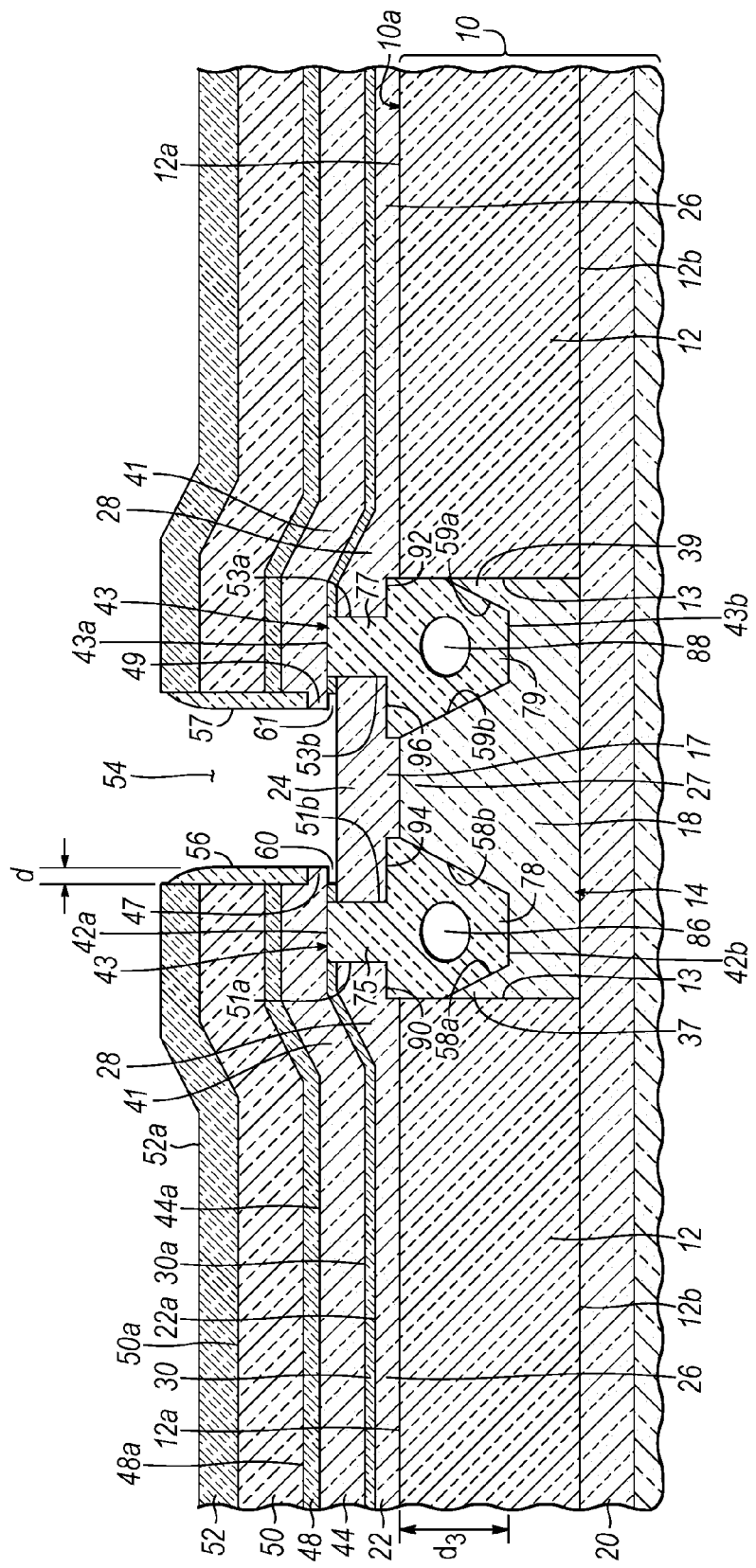

With reference to FIG. 8 in which like reference numerals refer to like features in FIG. 7 and at a subsequent fabrication stage of the processing method, the emitter opening 54, as narrowed by the presence of the spacers 56, 57, is extended in depth completely through the raised region of extrinsic base layer 44 using an anisotropic etching process, such as a RIE process. The etching process removes the material of extrinsic base layer 44 selectively (e.g., at a higher etch rate) to the materials comprising the spacers 56, 57 and the base dielectric layer 30. The etching process stops on the base dielectric layer 30. Adjacent to the emitter opening 54 and beneath the spacers 56, 57, sections 47, 49 of extrinsic base layer 44 retain the thickness $t_2$. The sidewall of section 47 is vertically aligned with the adjacent portion of the sidewall of the spacer 56 bordering the emitter opening 54. The sidewall of section 49 is vertically aligned with the adjacent portion of the sidewall of the spacer 57 bordering the emitter opening 54. The extrinsic base layer 44 retains the original thickness $t_1$ over a section 41 separated from the emitter opening by sections 47, 49.

The emitter opening 54 is extended in depth through the base dielectric layer 30 by an isotropic etching process, such as a wet chemical etching process. The etching process stops on the intrinsic base layer 22. The removal of this region of base dielectric layer 30 exposes the top surface 22a of intrinsic base layer 22 over a portion of the raised region 24. The isotropic etching process removes the material of base dielectric layer 30 selectively to the materials comprising the spacers 56, 57, the extrinsic base layer 44, and the intrinsic base layer 22. The wet chemical etching process may use either dilute hydrofluoric (DHF) or buffered hydrofluoric (BHF) as an etchant if the base dielectric layer 30 is comprised of $SiO_2$. If dielectric layer 52 is comprised of $SiO_2$ and contingent upon the etching conditions, the isotropic etching process may reduce the thickness of dielectric layer 52, as shown in the representative embodiment, or may completely remove dielectric layer 52 from dielectric layer 50.

Cavities 60, 61 are formed between the sections 47, 49 of extrinsic base layer 44 and the intrinsic base layer 22 when the base dielectric layer 30 is etched. Specifically, the isotropic etching process causes the base dielectric layer 30 to recede laterally beneath the sections 47, 49 of extrinsic base layer 44 and, more specifically, sidewalls of the base dielectric layer 30 are respectively caused to laterally recede relative to the respective sidewall of the sections 47, 49. In the representative embodiment, the sidewalls of the base dielectric layer 30 are each respectively recessed by a distance, d, relative to the sidewalls of sections 47, 49. In the representative embodiment, the cavities 60, 61 formed by the lateral recession of base dielectric layer 30 extend only partially across the raised region 24 of the intrinsic base layer 22. The etch bias may be controlled during etching to regulate the lateral recession of the base dielectric layer 30 and, hence, the location of the sidewalls of the base dielectric layer 30. The sections 47, 49 of extrinsic base layer 44 are undercut by the cavities 60, 61 and the cavities 60, 61 define open spaces between the intrinsic base layer 22 and the extrinsic base layer 44.

Because the top surface 44a of extrinsic base layer 44 is recessed before the spacers 56, 57 are formed, the sections 47, 49 of extrinsic base layer 44 are thinner than the remainder of extrinsic base layer 44 outside of the vicinity of the emitter opening 54. For example, the sections 47, 49 may be one half of the thickness of the remainder of extrinsic base layer 44, which is nominally equal to the original deposited thickness. The sections 47, 49 of extrinsic base layer 44 may extend about the perimeter of the emitter opening 54 and may be connected together to form a continuous structure.

Figure 9:
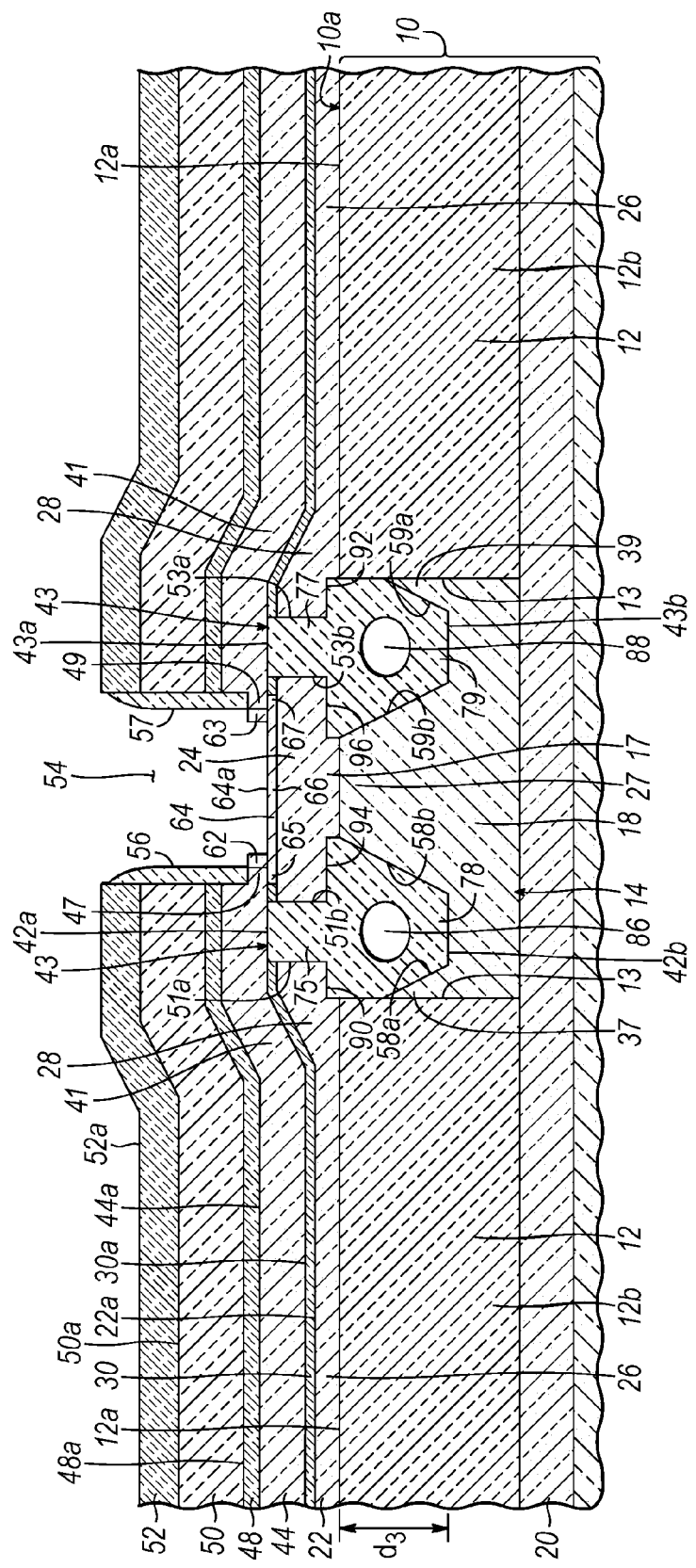

With reference to FIG. 9 in which like reference numerals refer to like features in FIG. 8 and at a subsequent fabrication stage of the processing method, a semiconductor layer 64 is formed as an additive layer on the top surface 22a of the intrinsic base layer 22 and, in the representative embodiment, is directly formed on the top surface 22a. The semiconductor layer 64 is comprised of semiconductor material deposited by an epitaxy method. The semiconductor material comprising the semiconductor layer 64 may be doped during or following deposition, or may be alternatively undoped. The semiconductor layer 64 may have a different composition than either the intrinsic base layer 22 or the extrinsic base layer 44.

During the deposition process, the semiconductor material of semiconductor layer 64 nucleates on the semiconductor material of the intrinsic base layer 22 and acquires the crystalline state of the intrinsic base layer 22. For example, the raised region 24 of intrinsic base layer 22, which is comprised of single crystal semiconductor material, may serve as a crystalline template for the growth of semiconductor layer 64. The deposition conditions are tailored so that there is no deposition on the spacers 56, 57 and dielectric layer 52 (or dielectric layer 50 if dielectric layer 52 has been previously removed). The thickness of the semiconductor layer 64 measured in a direction normal to its top surface 64a may be in the range for approximately 4 to 30 nm.

The semiconductor layer 64 includes a central section 66 flanked by peripheral sections 65, 67. Peripheral sections 65, 67, which are disposed along the outer perimeter or edges of semiconductor layer 64, respectively occupy the cavities 60, 61 and define a link electrically and physically coupling the intrinsic base layer 22 and the extrinsic base layer 44. The peripheral sections 65, 67 extend laterally from the respective sidewalls of the base dielectric layer 30 toward a centerline of the emitter opening 54. The peripheral sections 65, 67 of the semiconductor layer 64 and the extrinsic base layer 44 are in direct physical and electrical contact with each other, as are the peripheral sections 65, 67 and the top surface 22a of the intrinsic base layer 22. Specifically, the peripheral sections 65, 67 provide a direct connection for current flow between the extrinsic base layer 44 and the intrinsic base layer 22. The peripheral sections 65, 67 and the base dielectric layer 30 may have approximately equal layer thicknesses and, preferably, have equivalent layer thicknesses because the cavities 60, 61 are formed by the lateral recession of base dielectric layer 30 and then respectively filled by the peripheral sections 65, 67.

The central section 66 of the semiconductor layer 64, which is located outside of the cavities 60, 61, is disposed between the unfilled space of the emitter opening 54 and the intrinsic base layer 22.

The semiconductor material constituting semiconductor layer 64 also grows on the material of the sections 47, 49 of extrinsic base layer 44 and grows laterally inward as additive regions 62, 63 of polycrystalline material into the emitter opening 54. The deposition process is controlled such that the additive regions 62, 63 project a short distance into the emitter opening 54 so that the emitter opening 54 is not significantly pinched off.

Figure 10:
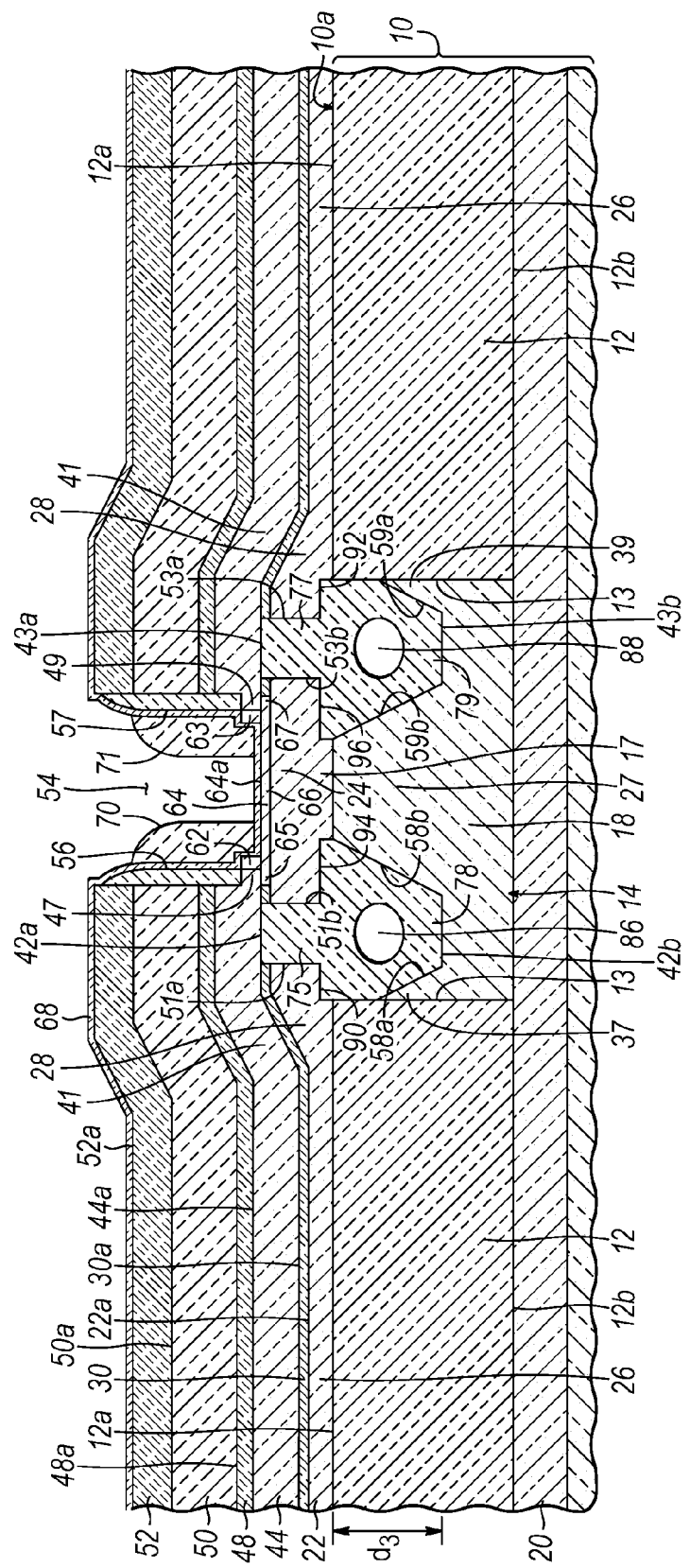

With reference to FIG. 10 in which like reference numerals refer to like features in FIG. 9 and at a subsequent fabrication stage of the processing method, a conformal layer 68 comprised of a dielectric material is deposited and spacers 70, 71 are formed on the spacers 56, 57 with conformal layer 68 as an intervening structure. The conformal layer 68 may be formed from a dielectric material that is electrically insulating, such as a thin layer of $SiO_2$ which may comprise a high temperature oxide (HTO) deposited by rapid thermal process (RTP) at temperatures of 500° C. or higher. Alternatively, the conformal layer 68 may be deposited by a different deposition process. Spacers 70, 71 are comprised of a dielectric material that is electrically insulating and etches selectively to the dielectric material comprising the conformal layer 68. For example, the spacers 70, 71 may be comprised of an electrical insulator, such as $Si_3N_4$, formed by deposition and anisotropic etching in a manner similar to spacers 56, 57. A portion of the conformal layer 68 covers the top surface 64a of the semiconductor layer 64 inside the emitter opening 54.

Figure 11:
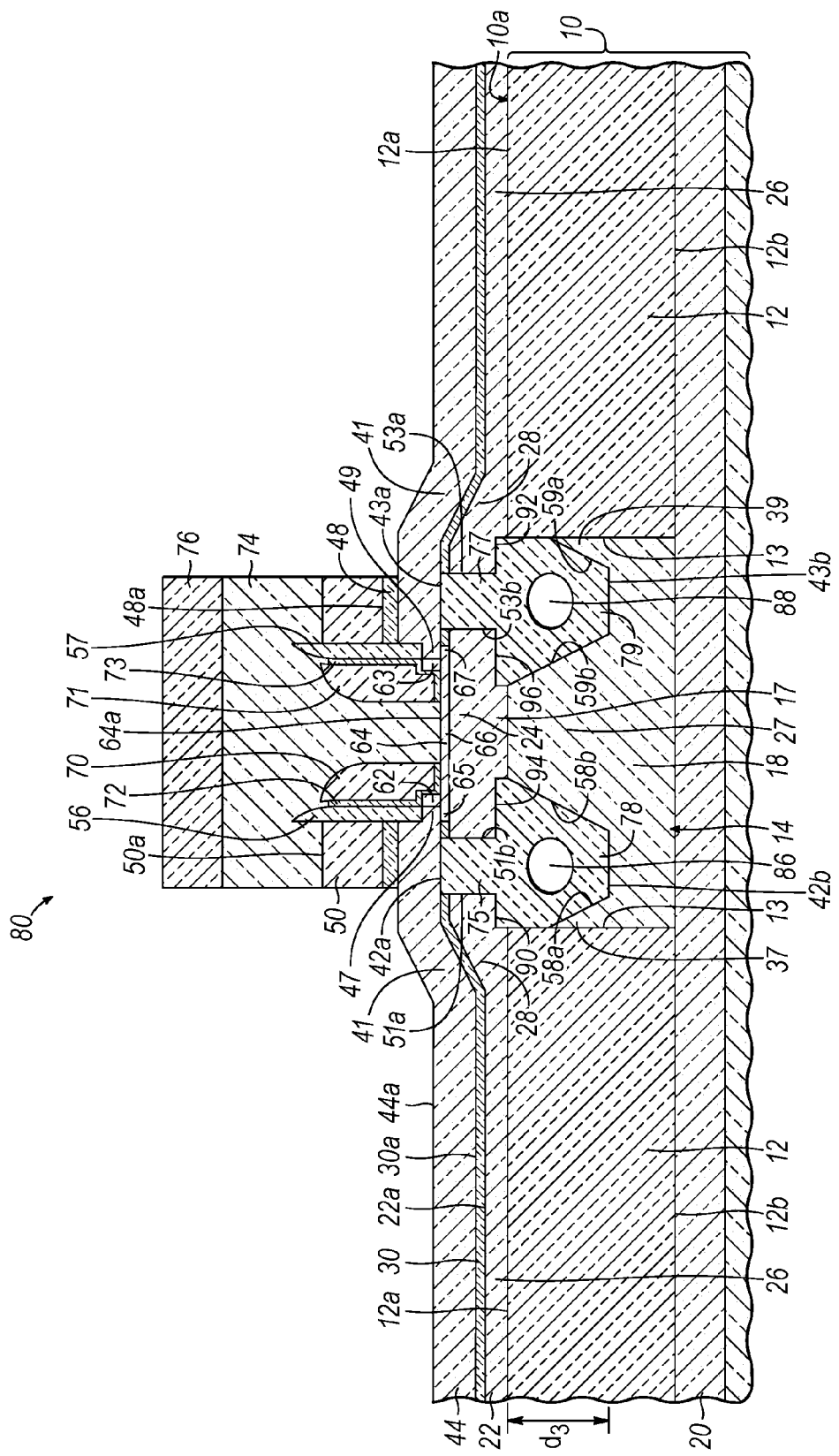

With reference to FIG. 11 in which like reference numerals refer to like features in FIG. 10 and at a subsequent fabrication stage of the processing method, a top surface 64a of the semiconductor layer 64 is exposed by an etching process that removes the material of the conformal layer 68 inside the emitter opening 54 and laterally between the spacers 70, 71. The etching process stops on the material constituting semiconductor layer 64. The etching process may be chemical oxide removal (COR) that removes the material of conformal layer 68, if comprised of $SiO_2$, with minimal undercut beneath the spacers 70, 71. A COR process may utilize a mixture flow of hydrogen fluoride (HF) and ammonia ($NH_3$) in a ratio of 1:10 to 10:1 and may be performed at reduced pressures (e.g., about 1 mTorr to about 100 mTorr) and at approximately room temperature. Portions of conformal layer 68 residing on dielectric layer 52 and the remnant of dielectric layer 52 are also removed by the etching process to reveal the top surface 50a of dielectric layer 50. An optional HF chemical cleaning procedure may follow the etching process. Spacers 72, 73 are formed from portions of the conformal layer 68 shielded during the performance of the etching process by the spacers 70, 71 and are respectively disposed between the spacers 56, 57 and the spacers 70, 71.

An emitter 74 of the bipolar junction transistor 80 is formed in the emitter opening 54. The non-conductive spacers 56, 57 and 70-73 encircle or surround the emitter 74 for electrically isolating the emitter 74 from the extrinsic base layer 44. The emitter 74 indirectly contacts the raised region 24 of intrinsic base layer 22 because of the intervening semiconductor layer 64. A dielectric cap 76 may be optionally formed on a head of the emitter 74 and may be comprised of an electrical insulator such as $Si_3N_4$.

The emitter 74 of the bipolar junction transistor 80 may be formed from a layer of a heavily-doped semiconductor material that is deposited and then patterned using lithography and etching processes. For example, the emitter 74 may be formed from polysilicon deposited by CVD or LPCVD and heavily doped with a concentration of a dopant, such as an impurities species from Group V of the Periodic Table, such as phosphorus (P), arsenic (As), to impart n-type conductivity. The heavy-doping level reduces the resistivity of the polysilicon and may be introduced by in situ doping that adds a dopant gas, such as phosphine or arsine, to the CVD reactant gases.

The lithography process forming the emitter 74 from the layer of heavily-doped semiconductor material may utilize photoresist and photolithography to form an etch mask that protects only a strip of the heavily-doped semiconductor material registered with the emitter opening 54. An etching process that stops on the material of layer 50 is selected to shape the emitter 74 from the protected strip of heavily-doped semiconductor material. The mask is subsequently removed to expose the top surface 50a of dielectric layer 50.

The emitter 74 is electrically and physically coupled with the intrinsic base layer 22 by the semiconductor layer 64. The bottom part of the emitter 74, which is located inside the emitter opening 54, directly contacts the top surface 64a of the semiconductor layer 64 and indirectly contacts the top surface 22a of intrinsic base layer 22 due to the intervening semiconductor layer 64. The head of the emitter 74 protrudes out of the emitter opening 54 and includes lateral arms that partially overlap with the top surface 50a of dielectric layer 50. While depicted as flat in the representative embodiment, the top surface of the head of emitter 74 may include a divot.

Dielectric layers 48, 50 are patterned using the same etch mask used to form the emitter 74 and the optional dielectric cap 76, and an etching process, such as RIE, with suitable etch chemistries. The etch mask is removed after shaping the dielectric layers 48, 50.

With reference to FIG. 12 in which like reference numerals refer to like features in FIG. 11 and at a subsequent fabrication stage of the processing method, the footprint of a bipolar junction transistor 80 on substrate 10 is fully defined by using conventional photolithography and etching processes to pattern the layers 22, 30, 44, 48, 50. Layers 22, 30, 44 are patterned to define an extrinsic base 82 of the bipolar junction transistor 80 from extrinsic base layer 44 and an intrinsic base 84 of the bipolar junction transistor 80 from intrinsic base layer 22. An etch mask is applied for use in a patterning process that relies on an etching process, such as a RIE process, with respective etch chemistries appropriate to etch the layers 22, 30, 44. Following the etching process, the etch mask is removed.

After patterning, the bipolar junction transistor 80 has a vertical architecture in which the intrinsic base 84 is located between the emitter 74 and the collector region 18, and the emitter 74, the raised region 24 of intrinsic base 84, and the collector region 18 are vertically arranged. One p-n junction is defined at the interface between the emitter 74 and the intrinsic base 84. Another p-n junction is defined at the interface between the collector region 18 and the intrinsic base 84.

The conductivity types of the semiconductor material constituting the emitter 74 and the semiconductor materials constituting extrinsic base 82 and intrinsic base 84 are opposite. The bipolar junction transistor 80 may be a heterojunction bipolar transistor in which the semiconductor material of the intrinsic base 84 has a value of energy bandgap that differs from the value of the energy bandgap of the semiconductor materials of the emitter 74 and collector region 18. In one embodiment, the emitter 74 and collector region 18 may be comprised of silicon and the intrinsic base 84 may be comprised of $Si_xGe_{1-x}$, which has a narrower energy bandgap than silicon. The bipolar junction transistor 80 may comprise either an NPN device or a PNP device contingent upon the conductivity types of the emitter 74, intrinsic base 84, and collector region 18.

The isolation regions 42, 43 may function to reduce the collector-base capacitance (Ccb) of the bipolar junction transistor 80. The parasitic capacitance between the extrinsic base layer 44 and the collector region 18 is proportional to the composite dielectric constant of the intervening materials. In this instance, the introduction of the isolation regions 42, 43 decreases the parasitic capacitance between the extrinsic base layer 44 and the collector region 18. The reduction in the parasitic capacitance represented by the reduced Ccb improves the performance of the bipolar junction transistor 80 by increasing figures of merit such as the cut-off frequency $f_T$ and the maximum oscillation frequency $f_{max}$. The link between extrinsic base 82 and intrinsic base 84 supplied by semiconductor layer 64 provides a self-aligned and reduced-parasitic linkup of the extrinsic base 82 to the intrinsic base 84.

The collector region 18 and intrinsic base 84 are coextensive across an area (the B-C area) defining an electrical and physical interface. The B-C area is given by the product of the length of the interior section 27 and the width, $w_2$, of the interior section 27 of the collector region 18 between the isolation regions 42, 43 at the top surface 10a. The B-C area is reduced by the inclination of the interior sidewalls 51b, 53b of isolation regions 42, 43.

The emitter 74 is electrically and physically coupled with the intrinsic base 84 by the semiconductor layer 64 across a surface area that is not impacted by the inclination of the respective interior sidewalls 58b, 59b of isolation regions 42, 43. As a result, the surface area across which the emitter 74 is indirectly coupled with the intrinsic base 84 may vary and optimized independent of the surface area across which the collector 18 is directly coupled with the intrinsic base 22.

The reduction in the surface area across which the collector 18 is directly coupled with the intrinsic base 22 may also operate to further reduce the Ccb of the bipolar junction transistor 80. In addition, the trapezoidal geometrical shape of the collector region 18 between the inclined interior sidewalls 58b, 59b of isolation regions 42, 43 may improve heat spreading by increasing heat transfer from the collector region 18 to the substrate 10 when the bipolar junction transistor 80 is operating and generating heat.

The bottom part of the emitter 74, which is located inside the emitter opening 54, directly contacts the top surface 64a of the semiconductor layer 64 and indirectly contacts the top surface 22a of intrinsic base layer 22 due to the intervening semiconductor layer 64. The shape of the isolation regions 42, 43 reproduce the geometrical shape of the trenches 34, 36.

During the front-end-of-line (FEOL) portion of the fabrication process, the device structure of the bipolar junction transistor 80 is replicated across at least a portion of the surface area of the substrate 10. In BiCMOS integrated circuits, complementary metal-oxide-semiconductor (CMOS) transistors (not shown) are formed using other regions of the substrate 10. As a result, both bipolar and CMOS transistors are available on the same substrate 10.

Standard silicidation and standard back-end-of-line (BEOL) processing follows, which includes formation of contacts and wiring for the local interconnect structure, and formation of dielectric layers, via plugs, and wiring for an interconnect structure coupled by the interconnect wiring with the bipolar junction transistor 80, as well as other similar contacts for additional device structures like bipolar junction transistor 80 and CMOS transistors (not shown) included in other circuitry fabricated on the substrate 10. Other active and passive circuit elements, such as diodes, resistors, capacitors, varactors, and inductors, may be fabricated on substrate 10 and available for use in the BiCMOS integrated circuit.

Figure 13:
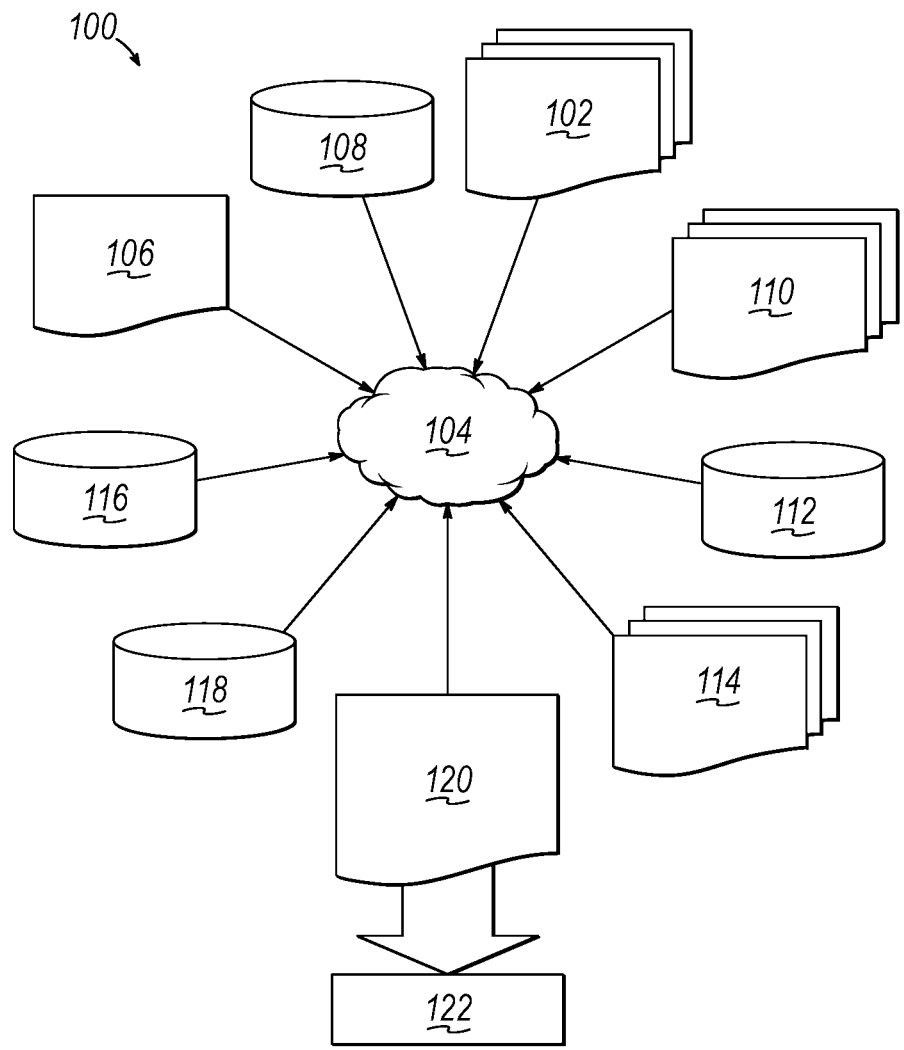
FIG. 13 is a flow diagram of a design process used in semiconductor design, manufacture, and/or test.

FIG. 13 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIG. 12. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 13 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIG. 12. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIG. 13 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 13. In one embodiment, design structure 120 may comprise a compiled, executable HDL simulation model that functionally simulates the devices shown in FIG. 12.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 12. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure for a bipolar junction transistor, the device structure comprising:
   a collector region;
   an intrinsic base on the collector region;
   an emitter coupled with the intrinsic base and separated from the collector by the intrinsic base; and
   a first isolation region extending through the intrinsic base to the collector region, the first isolation region having a first section with a plurality of first sidewalls extending through the intrinsic base and a second section with a plurality of second sidewalls extending into the collector region, and the second sidewalls inclined relative to the first sidewalls.

2. The device structure of claim 1 wherein the collector region has a top surface, the first sidewalls of the first isolation region are aligned perpendicular to the top surface of the collector region, and the second sidewalls of the first isolation region are inclined at an angle relative to the top surface of the collector region.

3. The device structure of claim 1 wherein the collector region is comprised of a single-crystal semiconductor material, and the second sidewalls of the first isolation region are oriented parallel to a crystallographic plane of the single-crystal semiconductor material of the collector region.

4. The device structure of claim 1 wherein the intrinsic base has a first surface coextensive with the collector region and a second surface coupled with the emitter, and the second surface has a surface area that is larger than a surface area of the first surface.

5. The device structure of claim 1 wherein the collector region is comprised of a first semiconductor material that is single crystal, and the intrinsic base is comprised of a second semiconductor material that etches at a significantly lower etch rate in an etchant solution comprising tetra-methyl-ammonium hydroxide (TMAH), potassium hydroxide (KOH), ammonium hydroxide ($NH_4OH$), or ethylenediamine pyrocatechol (EDP) than the first semiconductor material.

6. The device structure of claim 1 wherein the first isolation region is comprised of an electrical insulator, and includes a void unfilled by the electrical insulator.

7. The device structure of claim 1 wherein the intrinsic base includes a raised region coextensive with the collector region, the first isolation region extends through the raised region of the intrinsic base into the collector region, and further comprising:
   an extrinsic base separated from the collector by the intrinsic base; and
   a semiconductor layer on the raised region of the intrinsic base, the semiconductor layer physically linking the extrinsic base and the intrinsic base.

8. The device structure of claim 1 further comprising:
   a second isolation region surrounding the collector region, the second isolation region separated from the first isolation region by a portion of the collector region.

9. The device structure of claim 1 wherein the collector region is comprised of a single-crystal semiconductor material having a conductivity type.

* * * * *